(12) United States Patent
Chen et al.

(10) Patent No.: US 10,361,140 B2
(45) Date of Patent: Jul. 23, 2019

(54) WAFER STACKING FOR INTEGRATED CIRCUIT MANUFACTURING

(71) Applicant: International Business Machines Corporation, Armonk, NY (US)

(72) Inventors: Qianwen Chen, Ossining, NY (US); Bing Dang, Chappaqua, NY (US); John Knickerbocker, Monroe, NY (US); Joana Sofia Branquinho Teresa Maria, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/178,709

(22) Filed: Jun. 10, 2016

(65) Prior Publication Data

US 2017/0358554 A1    Dec. 14, 2017

(51) Int. Cl.
*H01L 23/31* (2006.01)
*H01L 25/00* (2006.01)
(Continued)

(52) U.S. Cl.
CPC ........ *H01L 23/3142* (2013.01); *H01L 21/563* (2013.01); *H01L 21/6835* (2013.01);
(Continued)

(58) Field of Classification Search
CPC . H01L 23/3142; H01L 23/562; H01L 21/563; H01L 21/6835; H01L 24/32; H01L 24/16; H01L 24/73; H01L 24/81; H01L 24/92; H01L 24/95; H01L 24/17; H01L 24/33; H01L 24/83; H01L 25/0652; H01L 25/50; H01L 2221/68368; H01L 2221/68386; H01L 2224/0401; H01L 2224/1134; H01L 2224/1308; H01L 2224/13111; H01L 2224/13147; H01L 2224/13155; H01L 2224/13157;
(Continued)

(56) References Cited

U.S. PATENT DOCUMENTS

6,224,690 B1   5/2001 Andricacos et al.
6,555,414 B1 * 4/2003 Vanfleteren .......... H01L 21/563
                                                    257/E21.503
(Continued)

*Primary Examiner* — Sitaramarao S Yechuri
(74) *Attorney, Agent, or Firm* — Scully, Scott, Murphy & Presser, P.C.; L. Jeffrey Kelly, Esq.

(57) ABSTRACT

A method of manufacturing integrated devices, and a stacked integrated device are disclosed. In an embodiment, the method comprises providing a substrate; mounting at least a first electronic component on the substrate; positioning a handle wafer above the first electronic component; attaching the first electronic component to the substrate via electrical connectors between the first electronic component and the substrate; and while attaching the first electronic component to the substrate, using the handle wafer to apply pressure, toward the substrate, to the first electronic component, to manage planarity of the first electronic component during the attaching. In an embodiment, a joining process is used to attach the first electronic component to the substrate via the electrical connectors. For example, thermal compression bonding may be used to attach the first electronic component to the substrate via the electrical connectors.

19 Claims, 8 Drawing Sheets

(51) Int. Cl.
*H01L 21/56* (2006.01)
*H01L 23/00* (2006.01)
*H01L 21/683* (2006.01)
*H01L 25/065* (2006.01)

(52) U.S. Cl.
CPC ............ *H01L 23/562* (2013.01); *H01L 24/32* (2013.01); *H01L 24/73* (2013.01); *H01L 24/81* (2013.01); *H01L 24/92* (2013.01); *H01L 24/95* (2013.01); *H01L 25/0652* (2013.01); *H01L 25/50* (2013.01); *H01L 24/16* (2013.01); *H01L 24/17* (2013.01); *H01L 24/33* (2013.01); *H01L 24/83* (2013.01); *H01L 2221/68368* (2013.01); *H01L 2221/68386* (2013.01); *H01L 2224/0401* (2013.01); *H01L 2224/1134* (2013.01); *H01L 2224/1308* (2013.01); *H01L 2224/13111* (2013.01); *H01L 2224/13147* (2013.01); *H01L 2224/13155* (2013.01); *H01L 2224/13157* (2013.01); *H01L 2224/13166* (2013.01); *H01L 2224/13171* (2013.01); *H01L 2224/16145* (2013.01); *H01L 2224/16146* (2013.01); *H01L 2224/16227* (2013.01); *H01L 2224/17181* (2013.01); *H01L 2224/32058* (2013.01); *H01L 2224/32105* (2013.01); *H01L 2224/32106* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01); *H01L 2224/8101* (2013.01); *H01L 2224/81005* (2013.01); *H01L 2224/81011* (2013.01); *H01L 2224/81065* (2013.01); *H01L 2224/81203* (2013.01); *H01L 2224/81815* (2013.01); *H01L 2224/81825* (2013.01); *H01L 2224/83102* (2013.01); *H01L 2224/92125* (2013.01); *H01L 2224/95* (2013.01); *H01L 2224/95001* (2013.01); *H01L 2225/06513* (2013.01); *H01L 2225/06517* (2013.01); *H01L 2225/06541* (2013.01); *H01L 2225/06593* (2013.01)

(58) Field of Classification Search
CPC . H01L 2224/13166; H01L 2224/13171; H01L 2224/16145; H01L 2224/16146; H01L 2224/16227; H01L 2224/17181; H01L 2224/32058; H01L 2224/32105; H01L 2224/32106; H01L 2224/32145; H01L 2224/32225; H01L 2224/33181; H01L 2224/73204; H01L 2224/73253; H01L 2224/81005; H01L 2224/8101; H01L 2224/81011; H01L 2224/81065; H01L 2224/81203; H01L 2224/81815; H01L 2224/81825; H01L 2224/83102; H01L 2224/92125; H01L 2224/95001; H01L 2225/06513; H01L 2225/06517; H01L 2225/06541; H01L 2225/06593

See application file for complete search history.

(56) References Cited

U.S. PATENT DOCUMENTS

| | | | |
|---|---|---|---|
| 7,932,584 | B2 | 4/2011 | Trezza |
| 8,030,137 | B2 | 10/2011 | Wachtler |
| 8,093,099 | B2 | 1/2012 | Purushothaman et al. |
| 8,211,756 | B2 | 7/2012 | Feng et al. |
| 8,386,690 | B2 | 2/2013 | Li et al. |
| 8,490,857 | B2 | 7/2013 | Matsui et al. |
| 8,679,861 | B2 | 3/2014 | Bose et al. |
| 8,772,921 | B2 | 7/2014 | Toh et al. |
| 8,796,047 | B2 | 8/2014 | Bose et al. |
| 2006/0073637 | A1* | 4/2006 | Yokoyama ............ H01L 23/481 438/109 |
| 2008/0105984 | A1 | 5/2008 | Lee |
| 2009/0023243 | A1* | 1/2009 | Koyanagi ............. H01L 21/568 438/107 |
| 2009/0103855 | A1 | 4/2009 | Binkert et al. |
| 2010/0083494 | A1* | 4/2010 | Lee ...................... B23K 37/047 29/832 |
| 2010/0102423 | A1* | 4/2010 | Otsuki ................ H01L 21/4828 257/676 |
| 2011/0156256 | A1 | 6/2011 | Kang et al. |
| 2011/0221053 | A1 | 9/2011 | Chandrasekaran et al. |
| 2012/0292788 | A1 | 11/2012 | Choi |
| 2013/0234322 | A1 | 9/2013 | Pendse |
| 2013/0288428 | A1* | 10/2013 | Oda ...................... H01L 24/19 438/107 |
| 2013/0330880 | A1* | 12/2013 | Dang ..................... H01L 24/97 438/113 |
| 2013/0341803 | A1 | 12/2013 | Cheah et al. |
| 2014/0097535 | A1 | 4/2014 | He et al. |
| 2015/0014688 | A1 | 1/2015 | Woychik et al. |
| 2015/0132527 | A1 | 5/2015 | Gambino et al. |
| 2016/0336292 | A1* | 11/2016 | Tian ....................... H01L 24/81 |

* cited by examiner

WAFER STACKING FOR INTEGRATED CIRCUIT MANUFACTURING

BACKGROUND

This invention generally relates to integrated devices, and more specifically, to integrated devices having die, chip, or other component stacks, and to method of manufacturing such integrated devices.

As electronic devices, such as smart phones, tablets and laptop computers, get smaller, lighter and faster, they need smaller and more multifunctional semiconductor devices, components and functions. To achieve this, semiconductor devices may be provided with a stack of two or more semiconductor chips or dies mounted on a substrate and connected together using fine pitch electrical connectors such as solder bumps or balls.

Semiconductor chip stack packages present many manufacturing challenges. A current approach for fine pitch assembly uses thermal compression bonding, which requires high cost tools, and has a relatively slow volume through-put. For instance, volume through-put is on the order of four to ten seconds per stack bond, and a nine high HMC stack could take, for example, thirty-six to ninety seconds to assemble. A second problem is wafer bow or die bow/planarity and handling for thin parts.

SUMMARY

Embodiments of the invention provide methods of manufacturing or assembling integrated devices and stacked integrated devices. In an embodiment, the method comprises providing a substrate, mounting at least a first electronic component on the substrate, positioning a handle wafer above the at least a first electronic component, and attaching the at least a first electronic component to the substrate via electrical connectors between the at least a first electronic component and the substrate. The method further comprises while attaching the at least a first electronic component to the substrate, using the handle wafer to apply pressure, toward the substrate, to the at least a first electronic component, to manage planarity of the at least a first electronic component during said attaching.

In an embodiment, the attaching the at least a first IC die to the substrate includes using a thermal reflow process to attach the at least a first IC die to the substrate via the electrical connectors.

In an embodiment, the attaching the at least a first electronic component to the substrate includes using a joining process to attach the at least a first electronic component to the substrate via the electrical connectors.

In an embodiment, the attaching the at least a first electronic component to the substrate includes using thermal compression bonding to attach the at least a first electronic component to the substrate via the electrical connectors, and the using the handle wafer includes using the handle wafer during the thermal compression bonding to apply pressure to the electrical connectors.

In an embodiment, the handle wafer is attached to the at least a first electronic component, and the method further comprises removing the handle wafer from the at least a first electronic component after the attaching the at least a first electronic component to the substrate.

In an embodiment, the mounting at least a first electronic component on the substrate includes mounting a plurality of electronic components on the substrate, one of the electronic component at a time, to form a stack of the electronic components on the substrate, said plurality of electronic components including the first electronic component and one or more additional electronic components; the attaching the at least a first electronic component to the substrate includes attaching each of the one or more additional electronic components to one of the electronic components below said each additional electronic component in the stack; and the using the handle wafer to apply pressure includes, while attaching each of the one or more additional electronic components, using the handle wafer to apply pressure, toward the substrate, to said each additional electronic component to manage co-planarity of the plurality of the electronic components.

In an embodiment, the at least a first electronic component is a first level electronic component; the handle wafer is attached to the first level electronic component; and the method further comprises, after the attaching the first level electronic component to the substrate, removing the handle wafer from the first level electronic component, mounting a plurality of second level electronic components on the first level electronic component, and attaching the second level electronic components to the first level electronic component via electrical connectors between the second level electronic components and the first level electronic component to form a plural level component stack on the substrate.

In an embodiment, the method further comprises using a first adhesive process to fill a space underneath the first level electronic component with a first adhesive to further attach the first level electronic component to the substrate, and using a second adhesive process to fill a space underneath the second level electronic components with a second adhesive to further attach the second level electronic components to the first level electronic component.

In an embodiment, the method further comprises, after the attaching the second level electronic components to the first level electronic component, removing the plural level component stack from the substrate, and transferring the plural level component stack onto another substrate.

In an embodiment, the mounting at least a first electronic component on the substrate includes forming a plurality of separate stacks on the substrate, each of the stacks including a plurality of flat electronic components; the attaching includes, in each of the stacks, attaching the electronic components of said each stack in place in said each stack; and the using the handle wafer includes, while attaching the electronic components of each stack in place, using the handle wafer to apply pressure, toward the substrate, to all of the plurality of stacks to manage co-planarity of the electronic components of the stacks.

In an embodiment, the method further comprises transferring the plurality of stacks from the substrate onto one or more other substrates.

In an embodiment, the invention provides a stacked integrated circuit device comprising a substrate, one or more electronic components mounted on the substrate, and one or more groups of electrical connectors for attaching the one or more electronic components in place in a stack on the substrate and for attaching the stack to the substrate. The stacked integrated device further comprises a handle wafer on the stack of the electronic components to apply pressure on the stack, toward the substrate, as the electronic components are attached in place and the stack is attached to the substrate, to manage co-planarity of the electronic components while the electronic components are attached in place and the stack is attached to the substrate.

In an embodiment, the handle wafer is attached to the stack of the one or more electronic components.

In an embodiment, the one or more electronic components includes a first electronic component mounted on the substrate, and a second electronic component mounted on the first electronic component; and the one or more groups of electrical connectors includes a first group of electrical connectors attaching the first electronic component to the substrate, and a second group of electrical connectors attaching the second electronic component to the first electronic component.

In an embodiment, the stacked integrated device further comprises a first adhesive filling a space beneath the first electronic component, between the first electronic component and the substrate, and a second adhesive filling a space beneath the second electronic component, between the second electronic component and the first electronic component.

In an embodiment, the one or more electronic components mounted on the substrate includes a multitude of flat electronic components forming a plurality of separate stacks on the substrate, each of the stacks comprising a plurality of the flat electronic components; and the handle wafer extends over all of said stacks to apply pressure, toward the substrate, to all of the plurality of stacks to manage co-planarity of the electronic components of the stacks.

As mentioned above, semiconductor chip stack packages present many manufacturing challenges or potential problems, including fine pitch assembly and wafer or die bow. Thermal compression bonding solution for fine pitch assembly exists but is too high cost for most high volume applications especially where one die is assembled per each cycle of the thermal compression bonding cycle.

High volume manufacturing solution use thinned die on handle wafer for test/replace/wafer level joining. This includes reflow (vol. w/fixture)/formic acid/uPillar assembly.

The high volume manufacturing solution using thinned die on a handle wafer also includes co-planarity management (handler) and stress management, solder to liquid transient metal (LTM)/intermetallic compound (IMC) for layer lock down (wafer-to-wafer (W2W) $1^{st}$ stacking), die to wafer for low volume or lower yielding wafers, and wafer to wafer for high volume using self repair designed into the circuits directly or through test and repair in circuits. The solution also includes use of Known Good Die (KGD) and/or test with self repair of die stack or module, and rework of known good die stacks (underfilled die stacks) (Ni/Fe Ball Limiting Metallurgy (BLM) for multiple reflow to IP.

Embodiments of the invention provide a number of advantages and features. For instance, embodiments of the invention provide 3D volume manufacturing using wafer to wafer die stack assembly with one or more handle wafers for co-planarity management and multiple die or wafer joining using reflow (or thermal compression bonding), formic acid or alternate no clean flux, transient liquid phase solder to IMC joining with solder balls and/or micro Pillar structures comprised of solder and a rigid pillar such as Cu, CuNi, TiNiCuNi or alternate pillar structure.

Embodiments of the invention, optionally, use reactive ion etch (RIE), deep reactive ion etch (DRIE) and/or Laser and/or mechanical saw sizing for singulation of die joining at wafer level. Embodiments of the invention, optionally, also can use known good die for assembly, use e-fuse or alternate self-test repair of die, die stack post assembly, and multiple reflow cycles to add one or more wafer levels per reflow toward ultimate systems micro-systems, sub systems or sub-micro-systems.

Embodiments of the invention may use Si or glass handle wafers for temporary co-planarity management of thin die, wafers and joining process with adhesive and subsequent debonding of one or more handle wafers per bonding cycle. Similarly, glass panels could be deployed with proper planarization specifications consistent with targeted interconnection density and die or component integration specifications to support alternative to glass or silicon wafer handle solutions or alternate handle-like solutions to support multi-die or component handling, processing, assembly integration and/or testing. In the case of glass or silicon wafer handling or alternate form factors, holes in the handle wafer can be used for atmosphere access such as formic acid in joining cycles to reduce or eliminate surface oxides on solder or joining pads. Embodiments of the invention provide the option to use fixtures to hold top and bottom wafers during reflow with a targeted gravitational weight or targeted force which can act as a weight, a clamp for position accuracy of each wafer or wafer/group of components to be joined and/or to avoid movement unless desired such as in surface tension casing solder reflow during the handling and joining process or solder reflow process. Embodiments of the invention also may add one or more layers with handle wafer support on one or both sides of stacked wafer pairs in one or more parallel operations or in sequential operations or steps.

Embodiments of the invention may optionally use capillary underfill for joining each layer up to all layers in the die stack or wafer stack in one or more steps, and may optionally use vacuum assisted underfill for joining each layer up to all layers in die stack or wafer stack in one or more steps. Embodiments of the invention also may optionally use pre-applied underfill to join each layer in the stack during bonding, and may optionally use laser or alternate dicing between die stacks to cut through adhesive of die stacks for singulation and for stress reduction.

Embodiments of the invention may optionally use Cu/Ni/Au, NiFe Au or alternate BLM at the bottom of a die stack for die stack to package interconnection such that solder bump interconnections, solder pillar (such as but not limited to solders such as SnAgCu or SnAg or alternate solder and pillar such as Cu or NiCu) or alternate pillar structures along with or without solder barrier layers such as Ni and/or NiFe or Cr or Co are able to reduce the reaction of solder with the underlying pillar structure such as Cu and therefore support subsequent post bonding processing or rework operations and support testing of the integrated structures, circuits, stacked die, components and/or systems.

Embodiments of the invention use stress management layers such as compressive or tensile layers to create improved coplanarity of die, wafer or bonded die or bonded wafers or bonded die or wafers with handle wafers during processing or for wafer stacks or die stacks post any handle wafer removal. Embodiments of the invention use die stack structures which may be comprised of one or more memory die, one or more logic die, one or more FPGA die, one or more network die, one or more antenna layers, one or more network or cross bar layers, one or more photonic layers as homogeneous or heterogeneous stacks, battery layers or sub-layers, packaging layers, capacitor layers, or other components, sub components, systems or sub-systems.

Embodiments of the invention provide an option for wafer to wafer permanent bonding using oxide or polymer adhesive and post via, through-silicon-vias (TSV) or through-dielectric-vias (TDV) interconnection in one or more layers in the stack, and with use of silicon on wafer (SOI) wafers or standard wafers such as bulk Silicon, 3-5 compound materials such as but not limited to GaAs or GaN or alternate wafer materials and/or circuits and/or passive function.

DETAILED DESCRIPTION

Embodiments of the invention provide integrated devices and methods of manufacturing integrated components. A wide range of devices may be made using embodiments of the invention. For instance, embodiments of the invention may be used to make integrated circuits, electronic components, electronic sub-components, capacitors, resistors, batteries, antenna, or electronic micro-systems.

Also, a wide variety of electronic components may be used in the manufacturing methods and processes disclosed herein. For example, the electronic components may be integrated circuit dies, which in turn may be processor circuits, memory circuits or a combination thereof. The memory circuits may be, for instance, double data rate type three (DDR3) synchronous dynamic random access memory (SDRAM) circuits. In other aspects, the dies may be other types of processor and/or memory circuits, communication circuits, and/or other function circuits. Other electronic components that may be used in this invention include battery components, resistor components, capacitor components, antenna components and other components that may form part of an electronic system, sub-system or microsystem.

Figure 1A:
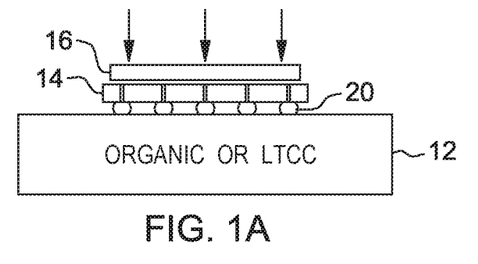
FIGS. 1A-1D illustrate a method of manufacturing a wafer die stack assembly, and a wafer made by the method, in accordance with an embodiment of the invention.

FIGS. 1A-1D show a first embodiment of the invention. FIG. 1A shows organic or LTCC substrate 12, an integrated circuit chip or die 14, and handle wafer 16. Chip 14 is connected to substrate 12 by solder bumps 21 and, in particular by thermal compression bonding. In this thermal compression bonding, solder bumps 20 are heated and pressure is applied to the solder bumps by applying pressure to handle wafer 16. The handle wafer also prevents the chip 14 from bending in this process.

Figure 1B:
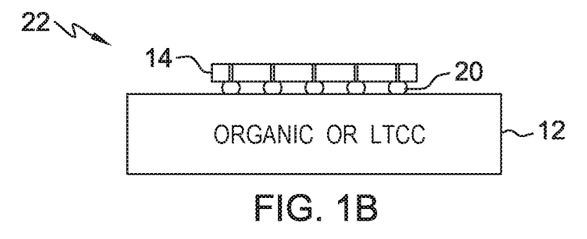

After the chip 14 is connected to substrate 12, handle 16 is removed, producing the device 22 shown in FIG. 1B. As one example, handle 16 may be removed by laser ablation. In particular, handle 16 is attached to chip 14 by an adhesive, and a laser is used to heat the adhesive to dissolve the adhesive and loosen the handle from the chip. The back of the chip may then be cleaned, for example by a chemical process.

Figure 1C:
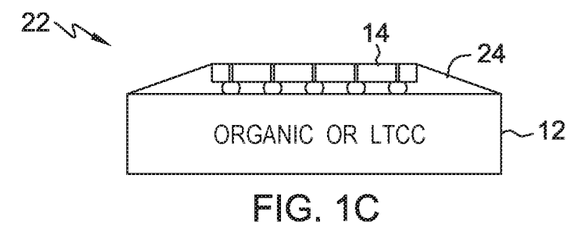

As shown in FIG. 1C., a liquid glue underfill 24 is applied to device 22, and this liquid underfill flows underneath chip 14. Any suitable liquid glue underfill procedure may be used, and any suitable liquid glue or adhesive material may be used in this process.

Figure 1D:
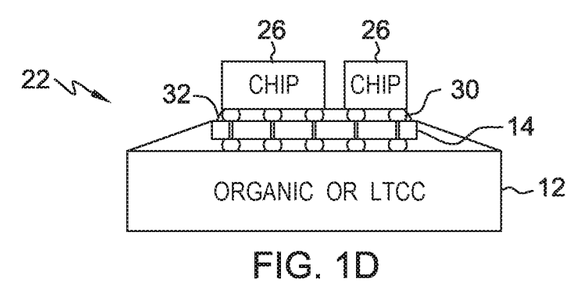

As illustrated in FIG. 1D, one or more chips 26 are mounted on chip 14, and chips 26 may be connected to chip 14 by solder bumps 30. A liquid glue underfill 32 may also be applied in which a liquid glue or adhesive flows underneath chips 26.

With this embodiment, device 22, as shown in FIG. 1D, comprises a level-one IC die 14 (also referred to herein as "bottom IC die") and two level-two IC dies 26, all of which may be made of semiconductor materials, such as, but not limited to, silicone and/or germanium. The IC dies 14, 26 may be any type of IC, such as, but not limited to, processing circuits, memory circuits, or a combination thereof. In one aspect, the level-one IC die 14 is an IC that is substantially a processing circuit, and the level-two dies 26 are memory circuits, such as double data rate type three (DDR3) synchronous dynamic random access memory (SDRAM) circuits. In other aspects, the dies 14, 26 may be other types of processing and/or memory circuits.

The level-one IC die 14 has an active surface side (e.g., front side surface) that includes a plurality of integrated circuit components (e.g., transistors, capacitors, inductors, resistors, etc.). Similarly, the level-two IC dies 26 each have an active surface side (e.g., front side surface) that includes a plurality of integrated circuit components (e.g., transistors, capacitors, inductors, resistors, etc.). The dies 14, 26 each have a back side surface as well.

The active surface of the level-one IC die 14 may be electrically coupled to the substrate 12 that it faces via a plurality of smaller electrical conductors 20, and the active surface of the level-two IC dies 26 may be electrically connected to the level-one IC die 14 via another plurality of electrical connectors 30. In the illustrated example, the electrical conductors 20, 30 are soldering balls, and thus the IC die 14 may be electrically coupled to the substrate 12 and IC dies 26 may be electrically coupled to IC die 14 in a ball grid array (BGA) flip chip fashion. However, the electrical conductors 20, 30 are not limited to soldering balls, and may be any metal, metal alloy, or conductive element that is capable of readily transmitting an electrical signal. For example, the electrical conductors 20, 30 may be, but are not limited to, soldering bumps, pillars, pins, stud bumps, and/or stacks of stud bumps.

In addition, in one aspect, the IC dies 14, 26 may electrically communicate with one another by transmitting and receiving electrical signals via interconnections within the multi-layer package. In another aspect, the level-one IC die 14 may be electrically coupled to the level-two IC dies 26 using through-silicon-vias (TSV) or alternate interconnections. For example, level-one IC die 14 may have both a front side and a back side. The front side of the level-one IC die 14 faces the smaller electrical conductors 20 and the back side of level-one IC die faces IC dies 26. Thus, TSV elements (not shown) may pass through the back side surface of the level-one IC die 14 and electrically couple with the active surfaces of the level-two IC dies 26. Consequently, the stacked IC dies may electrically communicate with each other through the substrate or through TSVs.

FIGS. 2A-2D illustrate a second embodiment, in which a chip stack is assembled on a handle wafer or a temporary chip attach (TCA) carrier or substrate and then transferred onto an organic or LTCC substrate.

Figure 2A:
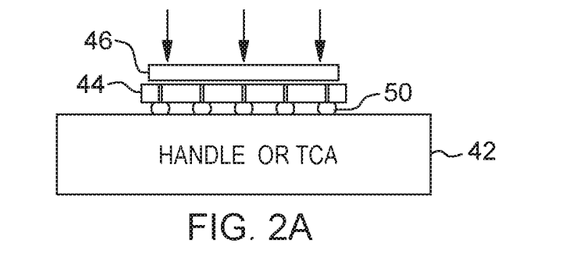
FIGS. 2A-2D show another embodiment of the invention in which a wafer die stack is assembled on a handle wafer or temporary chip attach (TCA) carrier or substrate.

FIG. 2A shows a handle wafer or TCE 42, an integrated circuit chip or die 44 and handle wafer 46. Chip 44 is connected to handle wafer or TCA 42 by solder bumps 50. Similar to the procedure shown in FIGS. 1A-1D, thermal compression bonding may be used to attached the chip 44 to the wafer or TCA 42, with the pressure applied via the handle 46.

The handling substrate 42 may be made of semiconductor material, glass, ceramic, or other materials. The handling substrate 42 preferably has a coefficient of thermal expansion ("CTE") less than $10*10^{-6}/°$ C. or may be nearly matched to silicon with CTE of about 3 ppm.

Figures 2B, 2C:
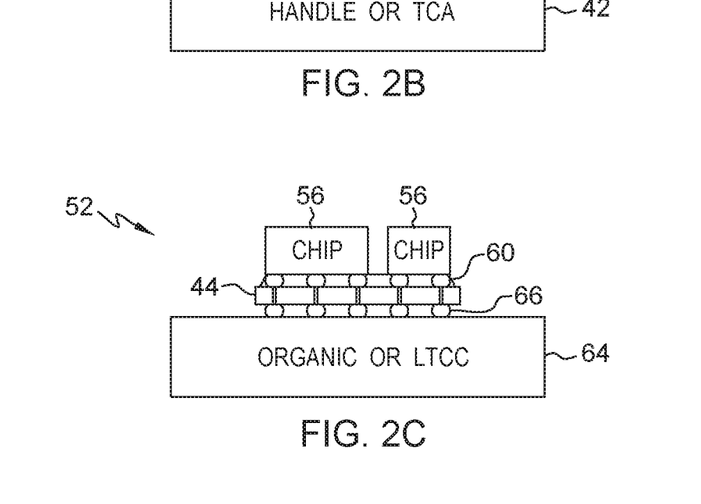

With reference to FIGS. 2A and 2B, after the chip 44 is attached to the handle or TCA 42, handle 46 is removed by using laser ablation to dissolve the adhesive attaching this handle to the chip. The chip may then be cleaned, for example by a chemical process. One or more chips 56 are then mounted on and attached to chip 44 by solder bumps 60. A liquid glue underfill 62 is applied to device 52, and the liquid adhesive, underfill or glue flows underneath chips 56.

Figure 2D:
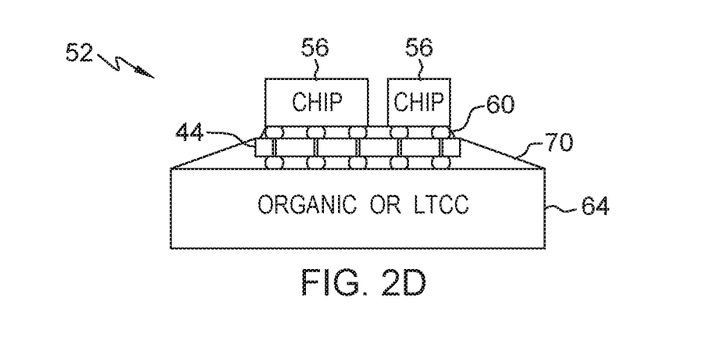

With reference to FIGS. 2B and 2C, chips 44, 56 are then detached from handle or TCA 42 and mounted on organic or LTCC substrate 64. Solder bumps 66 may be used to attach the chips to the substrate. As shown in FIG. 2D, a liquid glue underfill 70 is applied to device 52, and the liquid glue flows underneath chip 44. Any suitable liquid glue underfill procedure may be used.

Figure 3A:
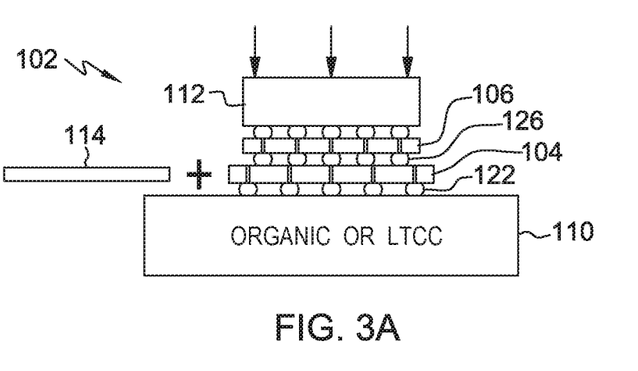
FIGS. 3A-3C depict a further embodiment of the invention in which a multi-chip stack is assembled on an organic or low temperature co-fixed ceramic (LTCC) substrate.
Figure 3B:
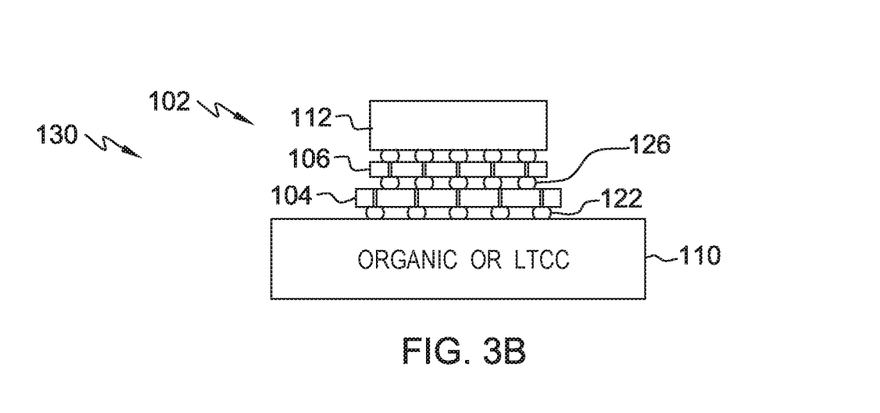
Figure 3C:
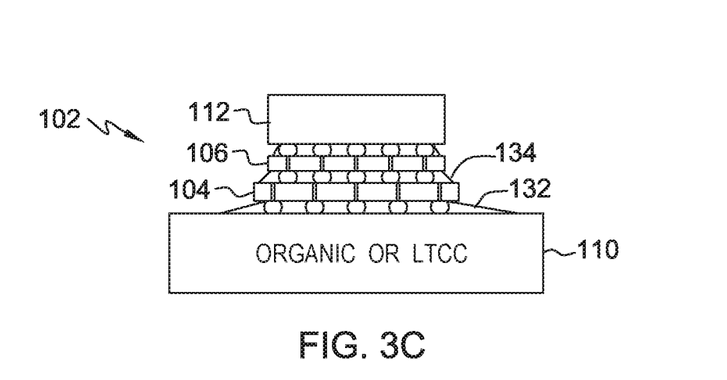

FIGS. 3A-3C show another embodiment of the invention. In this embodiment, a stack of thin chips, such as less than about 20 to 200 um thickness each, is assembled on an organic or LTCC substrate. The process of FIGS. 3A-3C may be preferred for use with smaller x,y size dies such as but not limited to <1 mm by <1 mm, up to about 15 mm by 15 mm.

FIG. 3A shows a stack 102 of thin chips 104, 106 on organic or LTCC substrate 110. The stack is assembled, one chip at a time, between the substrate and handle 112. After each joining step or cycle, a chip is added to the stack, another chip, represented at 114, can be added to the stack.

To assemble the stack 102, a first chip 104 is mounted on the substrate 110 and connected to the substrate by solder bumps 122 by thermal compression bonding. In this thermal compression bonding, solder bumps 122 are heated and pressure is applied to the solder bumps by applying pressure to handle wafer 112.

After the first chip 104 is attached, a second chip 106 is mounted on that first chip and connected to the first chip by solder bumps 126. Again, thermal compression bonding may be used to connect the second chip 106 to the first chip 104 via solder bumps 126. This process is repeated until the desired number of flat chips has been assembled, as shown in FIG. 3B.

After the desired number of chips has been assembled, a liquid adhesive or glue underfill process is applied to device 130 to fill the spaces between chips 104 and 106 and between the chip stack 102 and substrate 112, as shown in FIG. 3C. As an example, in this liquid glue underfill process, one glue 132 may be used to fill underneath chip 104, between that chip and substrate 112, and a second, different glue 134 may be used to fill underneath chip 106, between that chip and chip 104.

FIGS. 4A-4D show an embodiment of the invention similar to the embodiment shown in FIGS. 3A-3C; however, with the embodiment of FIGS. 4A-4D, the chip stack is formed on a handle wafer or TCA and then transferred to an organic or LTCC substrate. The procedure of FIGS. 4A-4D may be preferred for use with larger x,y size dies such as but not limited to >10 mm by 10 mm, to >25 mm by >30 mm.

Figure 4A:
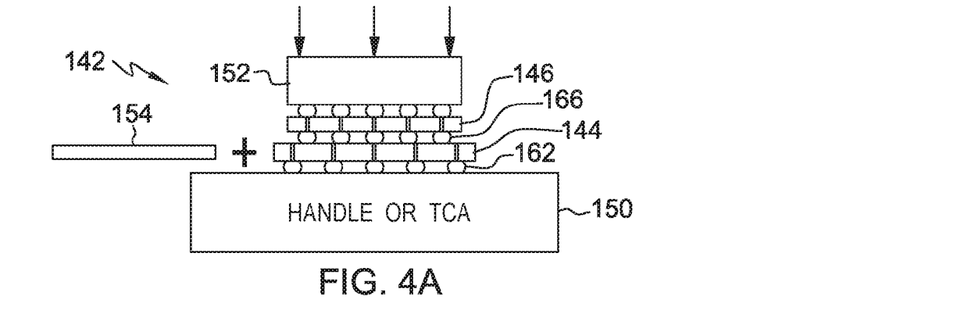
FIGS. 4A-4D show another embodiment of the invention in which a multi-chip stack is assembled between a pair of handle wafers or TCAs and then transferred to an organic or LTCC substrate.

FIG. 4A shows a stack 142 of thin chips 144, 146 on handle wafer or TCA wafer 150. The stack is assembled, one chip at a time, between wafer 150 and handle 152. After each time a chip is added to the stack, another chip, represented at 154, can be added to the stack.

To assemble the stack 142, a first chip 144 is mounted on the handle wafer or TCA 150 and attached thereto by solder bumps 162 by thermal compression bonding. In this bonding process, solder bumps 162 are heated and pressure is applied to the solder bumps by applying pressure to handle wafer 152. Handle wafer 152 also helps to keep the chips 144, 146 flat during this process.

Figure 4B:
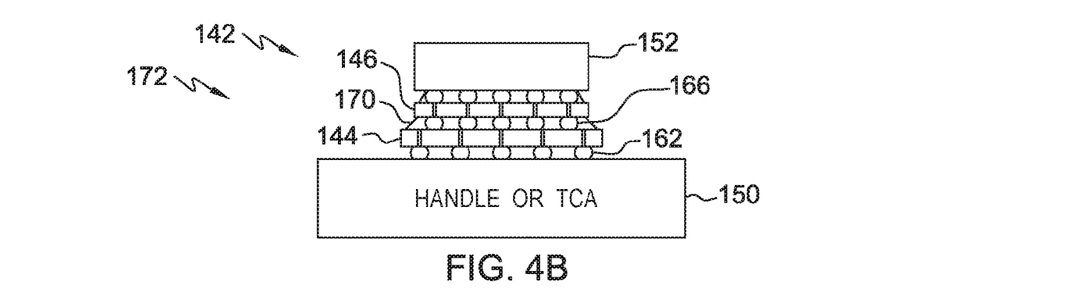

After the first chip 144 is attached, a second chip 146 is mounted on that first chip and attached to the first chip by solder bumps 166. Thermal compression bonding may be used to attach the second chip 146 to the first chip 144 via solder bumps 166. This process of adding chips to the stack is repeated until the desired number of flat chips has been assembled, as shown in FIG. 4B. An adhesive or glue underfill 170 is applied to device 172, and the liquid glue flows underneath handle 152 and chip 146. Any suitable adhesive or glue underfill procedure may be used.

Figure 4C:
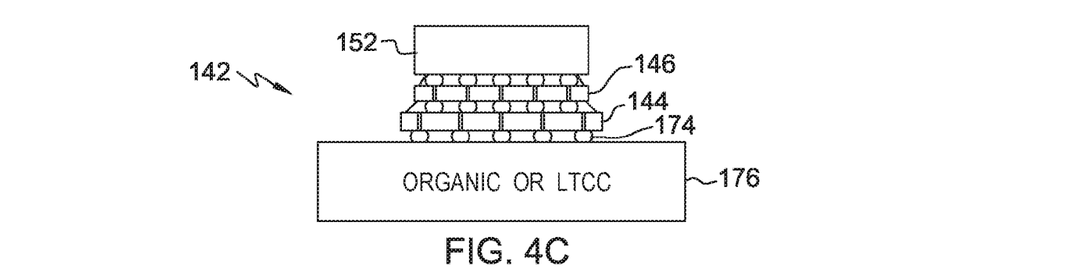
Figure 4D:
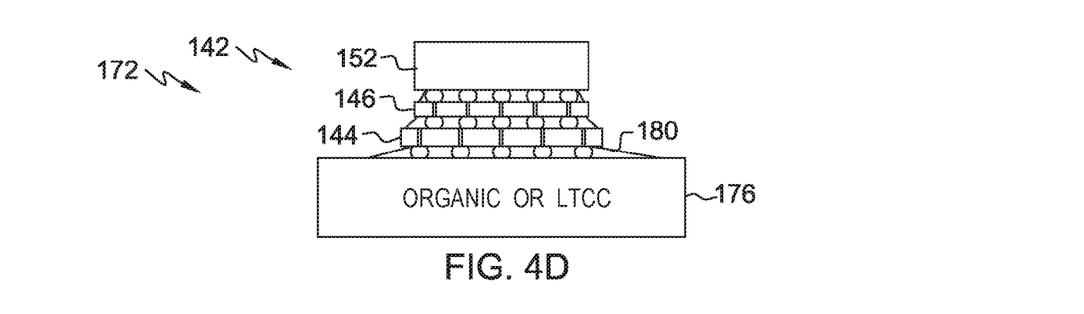

When the desired number of flat chips has been assembled, the chip stack 142, with upper handle 152, is removed from handle wafer or TCA 150 and mounted on organic substrate or LTCC 174, as shown in FIG. 4C. Solder bumps 176 may be used to attach the chip stack 142 to the substrate 174. With reference to FIG. 4D, when chip stack 142 is mounted on substrate 174, a liquid glue underfill 180 process is applied to device 172 to fill the space between the chip stack 142 and substrate 174.

FIGS. 5A-5D illustrate a process similar to the method depicted in FIGS. 1A-1D. With the process of FIGS. 5A-5D, thermal reflow is used in place of thermal compression bonding.

Figure 5A:
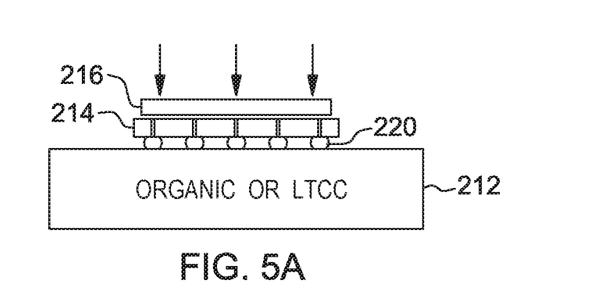
FIGS. 5A-5D show a method similar to FIGS. 1A-1D and in which a thermal reflow is used to attach the die to the substrate.

FIG. 5A shows organic or LTCC substrate 212, integrated circuit chip 214, and handling wafer 216. Chip 214 is connected to substrate 212 by solder bumps 220, and, in particular, by a thermal reflow process. In this thermal reflow, solder bumps 220 are heated to attach chip 214 to substrate 212. Handling wafer 216 is above chip 214, and applies pressure to the chip to keep the chip flat.

Figure 5B:
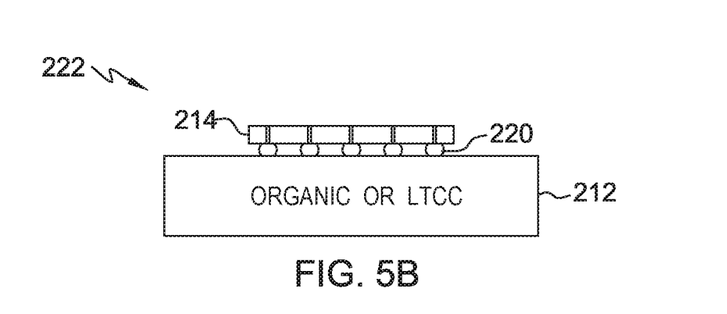

After the chip 214 is connected to substrate 212, handle 216 is removed, producing the device 222 shown in FIG. 5B. Handle 216 may be removed, for example, by laser ablation. More specifically, handle 216 is attached to chip 214 by an adhesive, and a laser it used to heat and to dissolve that adhesive. Handle 216 can then be removed from the chip 214. The back of the chip may then be cleaned by, for example, a chemical process.

Figure 5C:
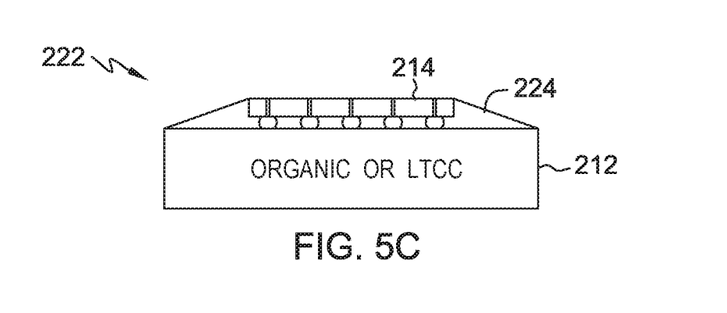

As shown in FIG. 5C, a liquid glue underfill 224 is applied to device 222, and this liquid underfill flows underneath chip 214. Any suitable liquid glue underfill procedure may be used.

Figure 5D:
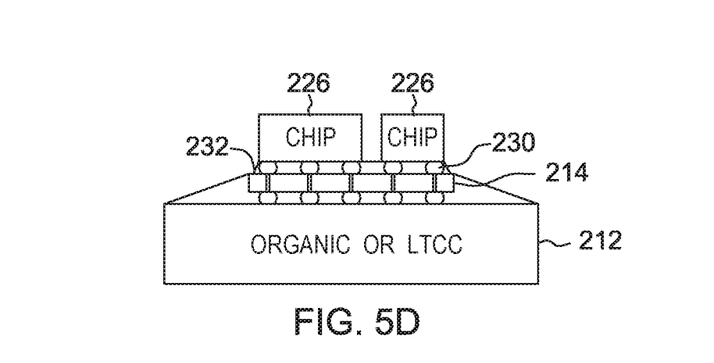

With reference to FIG. 5D, one or more chips 226 are then mounted on flat chip 214, and chips 226 may be connected to chip 214 by solder bumps 230. A thermal reflow process may be used to heat the solder bumps 230 to attach chips 226 to chip 214. A liquid glue underfill 232 may also be applied in which a liquid glue flows underneath chips 226.

FIGS. 6A-6D show an embodiment of the invention similar to the embodiment illustrated in FIGS. 2A-2D. In the embodiment of FIGS. 6A-6D, thermal reflow is used rather than thermal compression boding to attach the IC dies to each other and to the substrate.

Figure 6A:
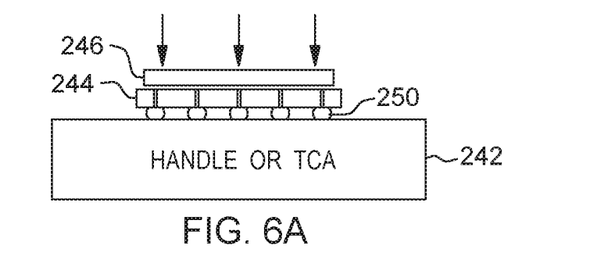
FIGS. 6A-6D illustrate a further embodiment of this invention similar to the embodiment of FIGS. 2A-2D and in which thermal reflows are used to assemble the die stack.

FIG. 6A shows a handle wafer or TCA 242, an integrated circuit chip or die 244 and handle wafer 246. Chip 244 is connected to handle wafer or TCA 242 by solder bumps 250. Similar to the procedure shown in FIG. 5A, thermal reflow may be used to attach the chip 244 to the wafer or TCA 242. Pressure may be applied to upper handling wafer 246, downward as shown in FIG. 6A, to keep the chip 244 flat.

Figure 6B:
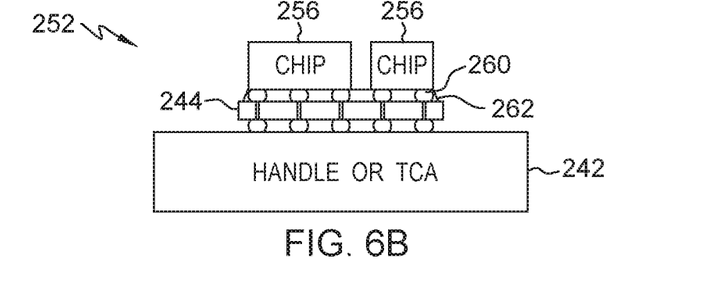

With reference to FIGS. 6A and 6B, after the chip 244 is attached to the handle or TCA 242, upper handle 246 is removed by using laser ablation to dissolve the adhesive attaching the handle to the chip. The chip may then be cleaned, for example, by a chemical process. One or more chips 256 are mounted on chip 244. Solder bumps 260 are used to attach chips 256 to chip 244, and a thermal reflow may be used to heat the solder bumps 260 to attach chips 256 to chip 244. An adhesive or glue underfill 262 is applied to device 252, and the integrated adhesive or glue underfill flows underneath chips 256.

Figure 6C:
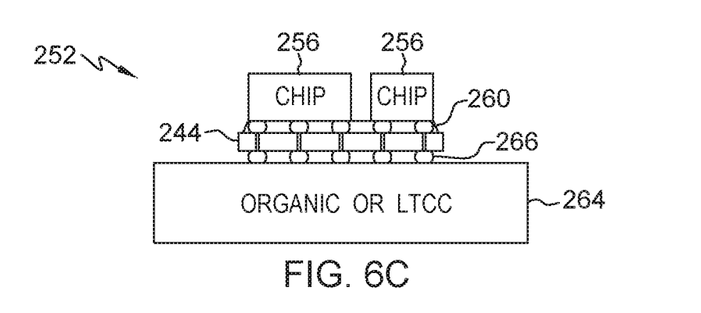
Figure 6D:
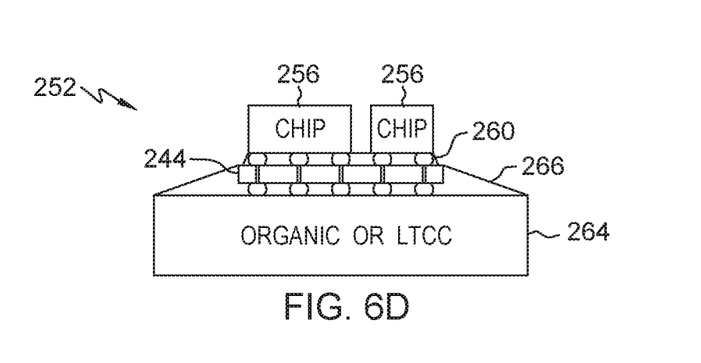

With reference to FIGS. 6B and 6C, chips 244, 256 are then detached from handle or TCA 242 and mounted on organic or LTTC substrate 264. Solder bumps 266 may be used to attaché the chips to this substrate, and a thermal reflow may be used to heat the solder bumps to attach the chips to substrate 264. As shown in FIG. 6D, a liquid glue underfill 266 is applied to device 252, and the liquid glue flows underneath chip 244. Any suitable liquid glue underfill procedure may be used.

Figure 7A:
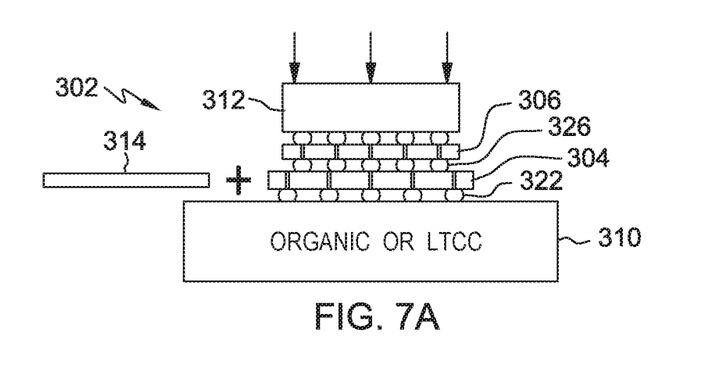
FIGS. 7A-7C show an embodiment of the invention similar to the embodiment of FIG. 3, and in which a thermal reflow is used in one part of the embodiment.
Figure 7B:
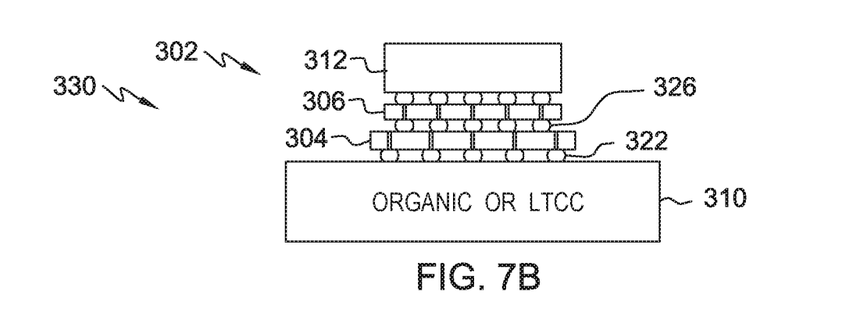
Figure 7C:
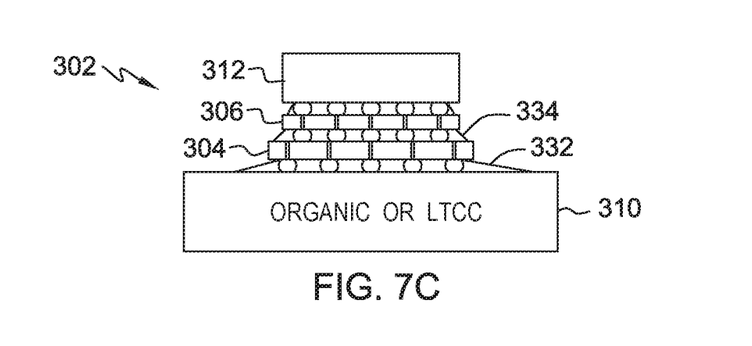

FIGS. 7A-7C illustrate a further embodiment, similar to the embodiment shown in FIGS. 3A-3C. With the embodiment of FIGS. 7A-7C, thermal reflow is used to heat the solder bumps to attach the chips to each other. The process of FIGS. 7A-7C, like the process of FIGS. 3A-3C, is particularly well suited for assembling smaller x,y size dies.

More specifically, FIG. 7A shows a stack 302 of chips 304, 306 on organic or LTCC substrate 310. The stack is assembled, one chip at a time, between the substrate and handle 312. After each time a chip is added to the stack, another chip, represented at 314, can be added to the stack.

To assemble the stack 302, a first chip 304 is mounted on the substrate 310 and attached to the substrate by solder bumps 322 by thermal reflow. Pressure may be applied to the chip 304 via handle wafer 312 to keep the chip flat.

After the first chip 304 is attached, a second chip 306 is mounted on that first chip and connected to the first chip by solder bumps 326. A thermal reflow may be used to heat the solder bumps 326 to attach chip 306 to chip 304. This process is repeated until the desired number of flat chips has been assembled, as shown in the device 330 in FIG. 7B.

After the chips have been assembled, an adhesive or glue underfill process is applied to fill the spaces between the chips 304 and 306 and between the chip stack 302 and substrate 312, as shown in FIG. 7C. In this liquid glue underfill process, one glue 332 may be used to fill underneath chip 304, between that chip and substrate 312, and a second, different glue 334 may be used to fill underneath chip 306, between that chip and chip 304.

FIGS. 8A-8D show another embodiment of the invention, and this embodiment is similar to the embodiment of FIGS. 4A-4D. In the embodiment of FIGS. 8A-8D, however, a plurality of chip stacks are formed on a substrate, and, in addition, thermal reflows, rather than thermal compression bonding, are used to attach the chips together. The procedure of FIGS. 8A-8D, like the procedure of FIGS. 4A-4D, is particularly well suited for forming stacks of larger x,y size dies.

Figure 8A:
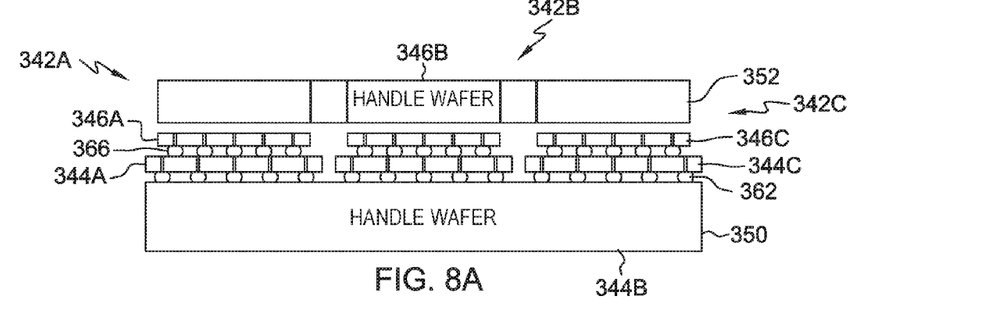
FIGS. 8A-8D illustrate another embodiment of the invention, similar to the embodiment of FIGS. 4A-4D, and in which multiple stacks are assembled between a pair of handle wafers or TCAs.

FIG. 8A shows a plurality of stacks 342A, 342B, 342C of flat chips formed on a bottom handle wafer 350, and an upper handle wafer 352 is located on top of the chip stacks and extends over all the chip stacks. As shown in FIG. 8A, stack 342A is comprised of chips 344A and 346A, stack 342B is comprised of chips 344B and 346B, and stack 432C is comprised of chips 344C and 346C. In this embodiment, stacks 342A, 342B, 342C are formed together, and each stack is formed one chip at a time. After each time a chip is added to a stack, another chip can be added to the stack.

To assemble the stacks, a first chip in each stack is mounted on the handle wafer or TCA 350 and attached thereto by a group of the solder bumps 362 by a thermal reflow process. In this thermal reflow process, the group of the solder bumps 362 are heated and attach the chip to handle wafer or TCA 350. Handle wafer 352 helps to keep these first chips flat during this process.

After the first chip of each stack is attached to handle wafer or TCA 350, a second chip of each stack is mounted on the first chip of each stack and attached to that first chip by a group of the solder bumps 366. Thermal reflow is also used to attach these second chips to the first chips via these solder bumps, and as this is done, upper handle 352 helps to keep the chips flat. This process of adding chips to the stacks may be repeated until the desired number of flat chips has been assembled in each stack.

Figure 8B:
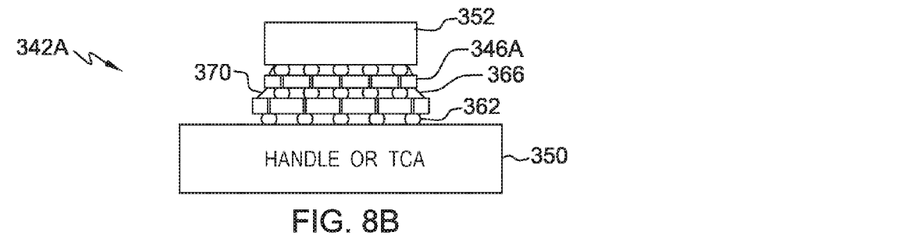

FIG. 8B shows one of the assembled stacks 342A. With reference to FIG. 8B, after the desired number of chips has been assembled in the stacks, a pre-applied solid adhesive or liquid glue underfill is applied to the stack, and the liquid glue 370 flows underneath handle wafer 352 and chip 346A. Any suitable pre-applied adhesive or liquid glue underfill process or procedure may be used.

Figure 8C:
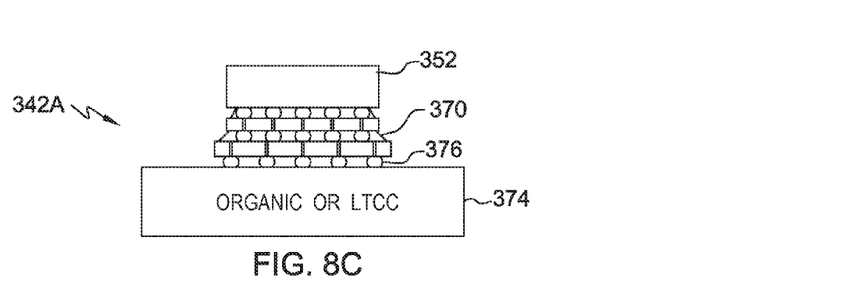
Figure 8D:
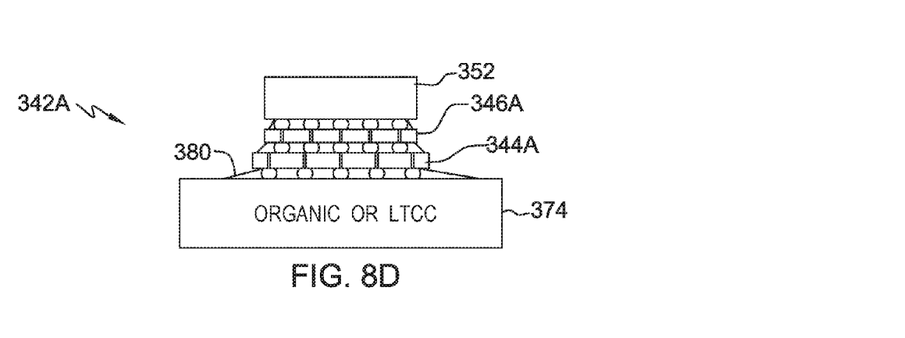

With reference to FIG. 8A-8C, the chip stack 342A, 342B and 342C, with upper handle 352, can be removed from handle wafer or TCA 350 and mounted on organic substrate or LTCC 374. A thermal reflow process may be used to heat solder bumps 376 to use the solder bumps to attach the chip stacks to substrate 374. With reference to FIG. 8D, when each chip stack is mounted on substrate 374, a liquid glue underfill 380 process is applied to the chip stack to fill the space between the chip stack and substrate 374.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:
1. A method of manufacturing integrated devices, comprising:
  providing a substrate;
  mounting at least a first flat electronic component on the substrate, the first electronic component having a thickness less than about 20 µm;
  positioning a handle wafer above the at least a first electronic component;

attaching the at least a first electronic component to the substrate via electrical connectors between the at least a first electronic component and the substrate; and while attaching the at least a first electronic component to the substrate, using the handle wafer to apply a pressure, toward the substrate, to the at least a first electronic component, to prevent the at least a first electronic component, having the thickness less than about 20 µm, from bending and to keep the first electronic component flat during said attaching the at least a first electronic component to the substrate; and wherein:

the attaching the at least a first electronic component to the substrate includes using solder or joining pads to attach the first electronic component to the substrate; and the handle wafer includes holes for atmosphere access to reduce or eliminate surface oxides on the solder or joining pads.

2. The method according to claim 1, wherein the attaching the at least a first electronic component to the substrate includes using a joining process to attach the at least a first electronic component to the substrate via the electrical connectors.

3. The method according to claim 1, wherein:
the attaching the at least a first electronic component to the substrate includes using thermal compression bonding to attach the at least a first electronic component to the substrate via the electrical connectors, including, in said thermal compression bonding, applying pressure to the electrical connectors by applying pressure to the handle wafer; and the pressure applied to the handle wafer in the thermal compression bonding prevents the at least first electrical component from the bending during said attaching.

4. The method according to claim 1, wherein:
the handle wafer is attached to the at least a first electronic component; and
the method further comprises removing the handle wafer from the at least a first electronic component after the attaching the at least a first electronic component to the substrate.

5. The method according to claim 1, wherein:
the mounting at least a first electronic component on the substrate includes mounting a plurality of electronic components on the substrate, one of the electronic components at a time, to form a stack of the electronic components on the substrate, said plurality of electronic components including the first electronic component and one or more additional electronic components;

the attaching the at least a first electronic component to the substrate includes attaching each of the one or more additional electronic component to one of the electronic components below said each additional electronic component in the stack; and the using the handle wafer to apply pressure includes, while attaching each of the one or more additional electronic components, using the handle wafer to apply pressure, toward the substrate, to said each additional electronic component to manage co-planarity of the plurality of the electronic components.

6. The method according to claim 1, wherein:
the at least a first electronic component is a first level electronic component;
the handle wafer is attached to the first level electronic component; and the method further comprises, after the attaching the first level electronic component to the substrate:
removing the handle wafer from the first level electronic component;
mounting a plurality of second level electronic components on the first level electronic component; and
attaching the second level electronic components to the first level electronic component via electrical connectors between the second level electronic component and the first level electronic component to form a plural level component stack on the substrate.

7. The method according to claim 6, wherein:
the attaching the at least a first electronic component to the substrate includes maintaining open space directly between the first level electronic component and the substrate during said attaching; and
the method further comprises:
using a first adhesive process to fill the open space directly between the first level electronic component and the substrate with a first adhesive to further attach the first level electronic component to the substrate; and
using a second adhesive process to fill a space underneath the second level electronic components with a second adhesive to further attach the second level electronic components to the first level electronic component.

8. The method according to claim 1, wherein:
the mounting at least a first electronic component on the substrate includes forming a plurality of separate stacks on the substrate, each of the stacks including a plurality of flat electronic components;
the attaching includes, in each of the stacks, attaching the electronic component of said each stack in place in said each stack; and
the using the handle wafer includes, while attaching the electronic device of each stack in place, using the handle wafer to apply pressure, toward the substrate, to all of the plurality of stacks to manage co-planarity of the electronic components of the stacks.

9. The method according to claim 8, further comprising transferring the plurality of stacks from the substrate onto one or more further substrates.

10. The method according to claim 1, wherein:
the at least a first electronic component has a size less than 1 mm by 1 mm; and
the attaching the at least a first electronic component to the substrate includes using a vacuum assisted underfill to fill a space between the at least a first electronic component and the substrate with a first adhesive to further attach the at least a first electronic component to the substrate.

11. The method according to claim 1, wherein:
the attaching the at least a first electronic component to the substrate includes using thermal reflow to heat the electrical connectors to attach the at least a first electronic component to the substrate; and
the using the handle wafer includes holding the handle wafer during the thermal reflow with a targeted force for position accuracy of the first electronic component and to avoid movement of the first electronic component during the thermal reflow.

12. A stacked integrated device comprising:
a substrate;
one or more flat electronic components mounted on the substrate, each of the electronic components having a thickness less than about 20 µm;

one or more groups of electrical connectors for attaching the one or more electronic components in place in a stack on the substrate and for attaching the stack to the substrate; and a handle wafer on the stack of the electronic components to apply a pressure on the stack, toward the substrate, as the electronic components are attached in place in the stack and the stack is attached to the substrate, to prevent the electronic components, each having the thickness less than about 20 µm, from bending and to keep the electronic components flat as the electronic components are attached in place in the stack and the stack is attached to the substrate; and wherein:

solder or joining pads are used to attach the one or more electronic components to the substrate; and the handle wafer includes holes for atmosphere access to reduce or eliminate surface oxides on the solder or joining pads.

13. The stacked integrated device according to claim 12, wherein:

the one or more electronic components includes a first electronic component mounted on the substrate, and a second electronic component mounted on the first electronic component; and the one or more groups of electrical connectors includes a first group of electrical connectors attaching the first electronic component to the substrate, and a second group of electrical connectors attaching the second electronic component to the first electronic component.

14. The stacked integrated device according to claim 13, wherein:

the one or more groups of electrical connectors attach the first electronic component in place spaced above the substrate; and the stacked integrated device further comprising:

a first adhesive filling a space beneath the first electronic component, directly between the first electronic component and the substrate; and a second adhesive filling a space beneath the second electronic component, between the second electronic component and the first electronic component.

15. The stacked integrated device according to claim 12, wherein:

the one or more electronic component mounted on the substrate includes a multitude of flat electronic components forming a plurality of separate stacks on the substrate, each of the stacks comprising a plurality of the flat electronic components; and the handle wafer extends over all of said stacks to apply pressure, toward the substrate, to all of the plurality of stacks to manage co-planarity of the electronic components of the stacks.

16. A method of assembling a stacked integrated circuit device, comprising:

providing a substrate;

mounting a plurality of flat electronic components on the substrate to form a stack of the electronic components on the substrate, each of the electronic components having a thickness less than about 20 µm;

attaching the plurality of electronic components in place in the stack and attaching the stack to the substrate via a plurality of groups of electrical connectors; and while attaching the plurality of electronic components in place in the stack, using a handle wafer to apply a pressure, toward the substrate, to the plurality of electronic components, each having the thickness less than about 20 µm, to prevent the electronic components from bending and to keep the electronic components flat during said attaching the plurality of electronic components in place in the stack; and wherein:

the attaching the plurality of electronic components includes using solder or joining pads to attach the plurality of electronic components to the substrate; and the handle wafer includes holes for atmosphere access to reduce or eliminate surface oxides on the solder or joining pads.

17. The method according to claim 16, wherein:

the attaching the plurality of flat electronic components includes attaching the electronic components in place in the stack, one of the electronic component at a time by using a respective one of the groups of electrical connectors; and the using the handle wafer includes using the handle wafer to apply pressure, toward the substrate, to each of the electronic components as said each electronic component is being attached in place in the stack.

18. The method according to claim 16, wherein:

the plurality of flat electronic components includes a bottom electronic component attached to the substrate, and a top electronic component; and the handle wafer is attached to the top electronic component.

19. The method according to claim 16, wherein:

the mounting a plurality of electronic components on the substrate includes forming a plurality of separate stacks on the substrate, each of the stacks including a respective group of the electronic components;

the attaching includes, in each of the stacks, attaching the electronic components of said each stack in place in said each stack; and the using the handle wafer includes positioning the handle wafer over all of said stacks to apply pressure, toward the substrate, to all of the plurality of stacks to prevent the electronic components of the stacks from bending during said attaching.

* * * * *